(12) United States Patent
Barchowsky et al.

(10) Patent No.: US 11,451,126 B2
(45) Date of Patent: Sep. 20, 2022

(54) FLYING CAPACITOR MULTILEVEL CONVERTERS FOR ANODE SUPPLIES IN HALL EFFECT THRUSTERS

(71) Applicant: California Institute of Technology, Pasadena, CA (US)

(72) Inventors: Ansel Barchowsky, Pasadena, CA (US); Ryan W. Conversano, Pasadena, CA (US); Christopher B. Stell, Valencia, CA (US); Vatché Vorperian, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 181 days.

(21) Appl. No.: 17/005,044

(22) Filed: Aug. 27, 2020

(65) Prior Publication Data
US 2021/0067044 A1    Mar. 4, 2021

Related U.S. Application Data

(60) Provisional application No. 62/892,229, filed on Aug. 27, 2019.

(51) Int. Cl.
*H02M 1/00* (2006.01)
*H02M 1/08* (2006.01)
(Continued)

(52) U.S. Cl.
CPC .......... *H02M 1/0095* (2021.05); *B64G 1/405* (2013.01); *B64G 1/428* (2013.01); *F03H 1/0018* (2013.01);
(Continued)

(58) Field of Classification Search
CPC ...... H02M 1/0095; H02M 1/08; H02M 3/003; H02M 3/335; H02M 7/4837;
(Continued)

(56) References Cited

U.S. PATENT DOCUMENTS

| 9,941,813 B2 * | 4/2018 | Yoscovich ........ H02M 7/4837 |
| 2021/0242768 A1 * | 8/2021 | Ishikura ............. H02M 3/158 |
| 2021/0296983 A1 * | 9/2021 | Rentmeister ..... G01R 19/16538 |

OTHER PUBLICATIONS

Meynard, T.A., et al., "Multi-Level Conversion: High Voltage Choppers and Voltage-Source Inverters", IEEE Power Electronics Specialists Conference, 1992, pp. 397-403.
(Continued)

*Primary Examiner* — Kyle J Moody
(74) *Attorney, Agent, or Firm* — Gates & Cooper LLP

(57) ABSTRACT

A flying capacitor multilevel (FCML) converter including a gate driver circuit comprising a DC-DC flyback converter having a plurality of isolated outputs. In various examples, the FCML circuit further includes a first control circuit connected to the FCML circuit determining the load current associated with a desired power output from the load; and determining a desired output voltage associated with the load current; a second control circuit that drives an inductor current ($I_L$) through the inductor so that the output applies an output voltage comprising the desired output voltage; and a third control circuit obtaining a comparison of an average of the inductor current ($I_L$) through the inductor with a predetermined reference current ($I_{LREF}$) and setting the duty cycle so that the average does not exceed the predetermined reference current. Also described is the converter driving a load comprising a plasma and a propulsion system comprising the converter.

21 Claims, 8 Drawing Sheets

(51) Int. Cl.
  *H01J 37/32* (2006.01)
  *B64G 1/42* (2006.01)
  *B64G 1/40* (2006.01)
  *H02M 3/00* (2006.01)
  *H02M 3/335* (2006.01)
  *F03H 1/00* (2006.01)

(52) U.S. Cl.
  CPC ......... *H01J 37/32009* (2013.01); *H02M 1/08* (2013.01); *H02M 3/003* (2021.05); *H02M 3/335* (2013.01)

(58) Field of Classification Search
  CPC .. H02M 3/33561; H02M 3/158; B64G 1/405; B64G 1/428; F03H 1/0018; H01J 37/32009
  See application file for complete search history.

(56) References Cited

OTHER PUBLICATIONS

Rentmeister, J.S., et al., "A Flying Capacitor Multilevel Converter with Sampled Valley-Current Detection for Multi-Mode Operation and Capacitor Voltage Balancing", IEEE Energy Conversion Congress and Exposition (ECCE), 2016, pp. 1-8.

Ye, Z., et al., "Improved Bootstrap Methods for Powering Floating Gate Drivers of Flying Capacitor Multilevel Converters and Hybrid Switched-Capacitor Converters", IEEE Transactions on Power Electronics, Jun. 2020, pp. 5965-5977, vol. 35, No. 6.

Ye, Z., et al., "Design and Implementation of a Low-cost and Compact Floating Gate Drive Power Circuit for GaN-based Flying Capacitor Multi-Level Converters", 2017 IEEE Applied Power Electronics Conference and Exposition (APEC), 2017, pp. 2925-2931.

* cited by examiner

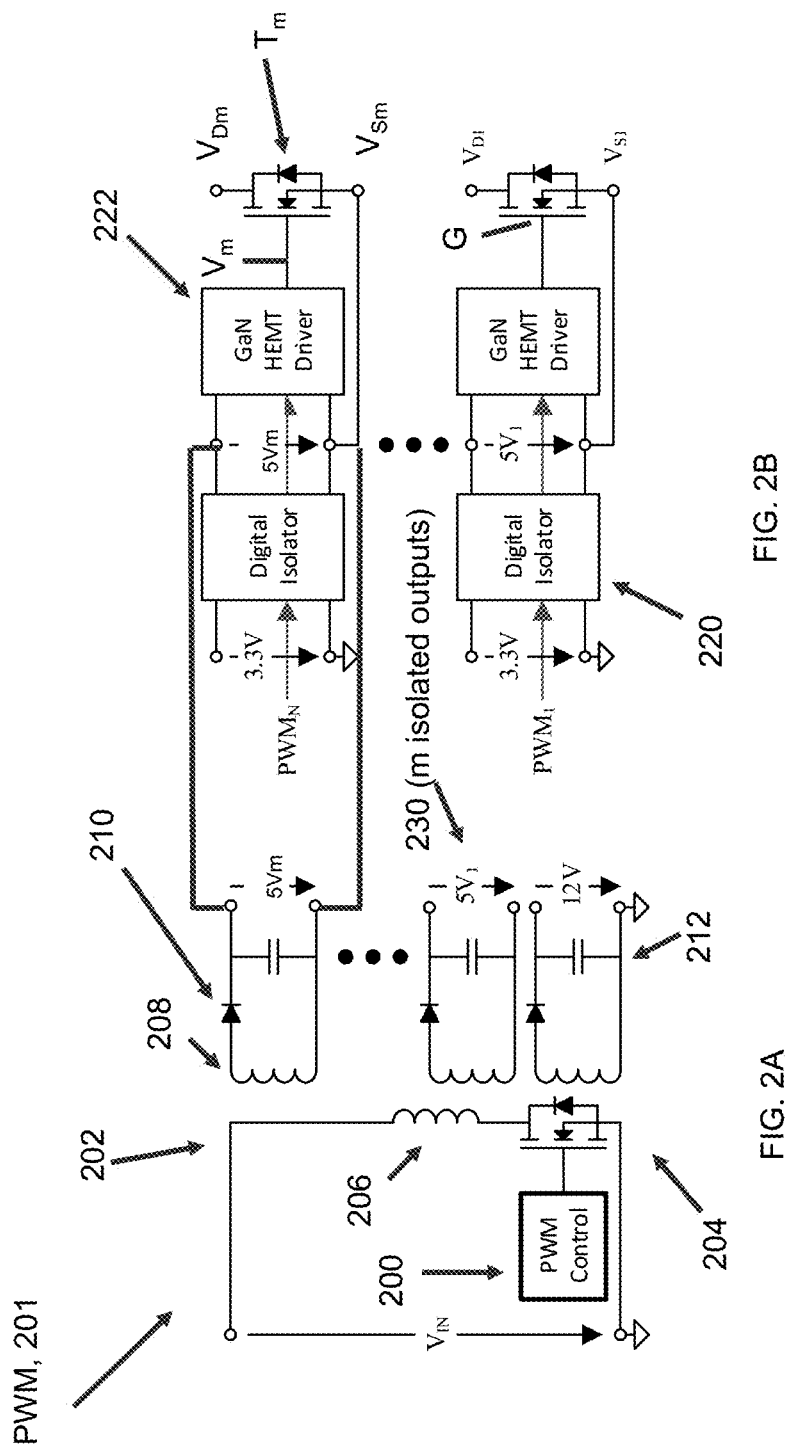

FLYING CAPACITOR MULTILEVEL CONVERTERS FOR ANODE SUPPLIES IN HALL EFFECT THRUSTERS

CROSS REFERENCE TO RELATED APPLICATIONS

This application claims the benefit under 35 USC 119(e) of co-pending and commonly assigned U.S. Provisional Patent Application Ser. No. 62/892,229, filed Aug. 27, 2019, by Ryan W. Conversano, Christopher B. Stell, and Ansel Barchowsky, entitled "Flying Capacitor Multilevel Converters for Anode Supplies in Hall Effect Thrusters," which application is incorporated by reference herein.

STATEMENT REGARDING FEDERALLY SPONSORED RESEARCH AND DEVELOPMENT

This invention was made with government support under Grant No. 80NM0018D004 awarded by NASA (JPL). The government has certain rights in the invention.

BACKGROUND OF THE INVENTION

1. Field of the Invention

The present disclosure relates to flying capacitor multilevel converters and methods of making the same.

2. Description of the Related Art

There is significant interest in deep-space small-satellites in the 50 to 300 kg range. To meet the needs of this unique class of mission, the Ascendant Sub-kW Transcelestial Electric Propulsion System (ASTRAEUS) program has been formulated to provide these systems with the next generation of small spacecraft propulsion. ASTRAEUS is based around the MaSMi (Magnetically Shielded Miniature) Hall thruster, which provides long-life propulsion capabilities for deep-space small spacecraft missions. To meet the wide throttling needs of the MaSMi thruster from 200 to 500 V, coupled with Power Processing Unit (PPU) requirements demanding a compact (<3 kg, <3 L) and highly efficient (>95%) system, existing flyback and full-bridge converter designs are not suitable. Instead, this development demanded a new type of Anode supply, capable of wide duty cycle changes with a wide array of input voltages. The present disclosure satisfies this need.

SUMMARY OF THE INVENTION

The present disclosure describes FCML converter circuits and applications thereof. Example embodiments include, but are not limited to, the following.

1. A DC-DC converter circuit, comprising:
an inductor;
a flying capacitor multilevel (FCML) converter circuit connected to the inductor and including a plurality m of transistors including a plurality of first transistors $T_{1n}$ and a plurality of second transistors $T_{2n}$, where m an n are integers and the FCML further comprises:
a plurality of n cells each including one of the first transistors $T_{1n}$, one of the second transistors $T_{2n}$, and a capacitor having a first terminal and a second terminal;
a first voltage rail connected to an output of the inductor and including first transistors connected in series, each of the first transistors having a first gate;
a second voltage rail comprising the second transistors connected in series, each of the second transistors having a second gate; and
wherein each of the cells are switched on and off to charge the capacitors in response to gate voltages $V_m$ applied to the first gates and the second gates,
for each of the number n of first transistors $T_{1n}$, the gate voltage $V_m=T_{1n}$ applied to the first gate of the $T_{1n}^{th}$ first transistor is modulated by a duty cycle and referenced to the first voltage rail at a location of the input to the $T_{1n}^{th}$ transistor;
for each of the number n of second transistors $T_{2n}$, the gate voltage $V_m=V_{2n}$ applied to the second gate of the $T_{2n}^{th}$ second transistor is modulated by the duty cycle and referenced to the second voltage rail at the location of the input to the second transistor;
a gate driver circuit comprising:
DC-DC flyback converter having a plurality m of isolated outputs, wherein m=2n:
each of the m isolated outputs outputting the gate voltage $V_m$ to the driver circuit of the $m^{th}$ transistor (each of the gate voltages referenced to the source of the respective transistor); and
one or more modulators modulating each of the gate voltages Vm with the duty cycle D having a phase $PWM_m$; and
a plurality of isolation circuits, each of the isolation circuits isolating the one or more modulators from the voltage rails comprising floating voltage rails.

2. The circuit of example 1, further comprising:
a thermal strap thermally connecting each of the transistors to a heat sink, so that heat is conducted by the thermal strap from the transistor to the heat sink so as to cool the transistors or switches; and
a material comprising a thermal conductor and an electrical isolator between each of the thermal straps and each of the transistors.

3. The circuit of example 2, wherein the material is connected at one end to a contact of the transistor or switch and at another end to the heat sink or chassis.

4. The circuit of example 3, wherein the contact is a drain of the transistor.

5. The circuit of any of the examples 1-4, further comprising:
a load comprising a plasma across an output of the FCML and requiring a load current for operation of the load;
a first control circuit connected to the FCML circuit, the first control circuit:
determining the load current associated with a desired power output from the load; and
determining a desired output voltage associated with the load current;
a second control circuit that drives an inductor current ($I_L$) through the inductor so that the output applies an output voltage comprising the desired output voltage or the output voltage sufficiently close to the desired output voltage; and
a third control circuit obtaining a comparison of an average of the inductor current ($I_L$) through the inductor with a predetermined reference current ($I_{LREF}$) and setting the duty cycle so that the average does not exceed the predetermined reference current.

6. A DC-DC converter circuit, comprising:

an inductor;

a flying capacitor multilevel (FCML) converter circuit connected to the inductor and including a plurality of cells, each of the cells including two semiconductor switches and a capacitor and the FCML converter circuit having an output;

a modulator switching the semiconductor switches on and off according to a duty cycle, the duty cycle controlling a voltage charging the capacitor in each of the cells;

a load comprising a plasma across the output requiring a load current for operation of the load;

a first control circuit connected to the FCML circuit, the first control circuit:

determining the load current associated with a desired power output from the load; and determining a desired output voltage associated with the load current;

a second control circuit that drives an inductor current ($I_L$) through the inductor so that the output applies an output voltage comprising the desired output voltage or the output voltage sufficiently close to the desired output voltage; and a third control circuit obtaining a comparison of an average of the inductor current ($I_L$) through the inductor with a predetermined reference current ($I_{LREF}$) and setting the duty cycle so that the average does not exceed the predetermined reference current.

7. The circuit of example 5 or 6, wherein the second control circuit comprises a proportional-integral-derivative controller loop driving a difference to zero, wherein the difference is between the output voltage (measured at the output) and the desired output voltage.

8. The circuit of example 5 or 6, wherein the average comprises a cycle by cycle average of the inductor current.

9. The circuit of any of the examples 6-8, further comprising:

a thermal strap thermally connecting each of the transistors or switches to a heat sink, so that heat is conducted by the thermal strap from the transistor or switches to the heat sink so as to cool the transistors or switches; and a material comprising a thermal conductor and an electrical isolator between each of the thermal straps and each of the transistors or switches.

10. The circuit of example 9, wherein the material is connected at one end to a contact of the transistor or switch and at another end to the heat sink or chassis.

11. The circuit of example 10, wherein the contact is a drain of the transistor.

12. A spacecraft comprising the DC-DC converter circuit of any of the claims 1-10.

13. A propulsion system, comprising the DC-DC converter circuit of any of the examples 1-12, comprising:

an anode connected to an output of the last cell (nth cell), wherein the desired output voltage from the output is used to generate an electric field or electromagnetic field used to guide and/or accelerate charged particles so that the charged particles generate the desired output comprising a thrust.

14. The propulsion system of example 13, wherein the propulsion system comprises a hall effect thruster or ion thruster.

15. The spacecraft of any of the examples 12-14 comprising a satellite.

16. The converter of any of the examples 1-5, further comprising a load connected to the FCML circuit, the load comprising a plasma load, a load comprising a plasma, or an oscillating load wherein current is oscillating periodically in time.

17. A deposition system or cleaning system utilizing a plasma and comprising the DC-DC converter circuit of any of the examples 1-15.

18. A DC-DC converter circuit, comprising:

an inductor;

a flying capacitor multilevel (FCML) converter circuit connected to the inductor and including a plurality m of transistors including a plurality of first transistors $T_{1n}$ and a plurality of second transistors $T_{2n}$, where m an n are integers and the FCML further comprises:

a plurality of n cells each including one of the first transistors $T_{1n}$, one of the second transistors $T_{2n}$, and a capacitor having a first terminal and a second terminal;

a first voltage rail connected to an output of the inductor and including first transistors connected in series;

a second voltage rail comprising the second transistors connected in series; and a gate driver circuit comprising a DC-DC flyback converter having a plurality m of isolated outputs, wherein m=2n and each of the m isolated outputs are electrically connected to the gate of one of the transistors.

19. The converter of example 18 further comprising any of the features in examples 1-17.

20. The converter of any of the examples 1-19 wherein the voltage Vm applied to each gate of the transistor is modulated with a phase PWMm and duty cycle D by a modulator.

BRIEF DESCRIPTION OF THE DRAWINGS

Referring now to the drawings in which like reference numbers represent corresponding parts throughout:

FIGS. 2A-2C illustrates gate driver circuitry for the FCML according to one or more embodiments described herein, wherein FIG. 2A illustrates a power isolator, FIG. 2B illustrates the digital signal isolator, and FIG. 2C illustrates a fabricated FCML and driver circuit.

FIGS. 4A-4F illustrate thermal heat strap configurations for conductive cooling of the transistors according to one or more embodiments described herein, wherein FIG. 4A illustrates the thermal straps connected to the heat sink (chassis), FIG. 4B illustrates the thermal straps connected to the FCML, FIG. 4C illustrates a thermal strap comprising a metal strip, FIG. 4D illustrates connection of the thermal strap to the transistor, FIG. 4E is side view of the thermal strap connected to transistor and printed wiring board (PWB), and FIG. 4E is a side view schematic of the thermal strap and thermal conductor/electrical isolator connected to the transistor.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1:
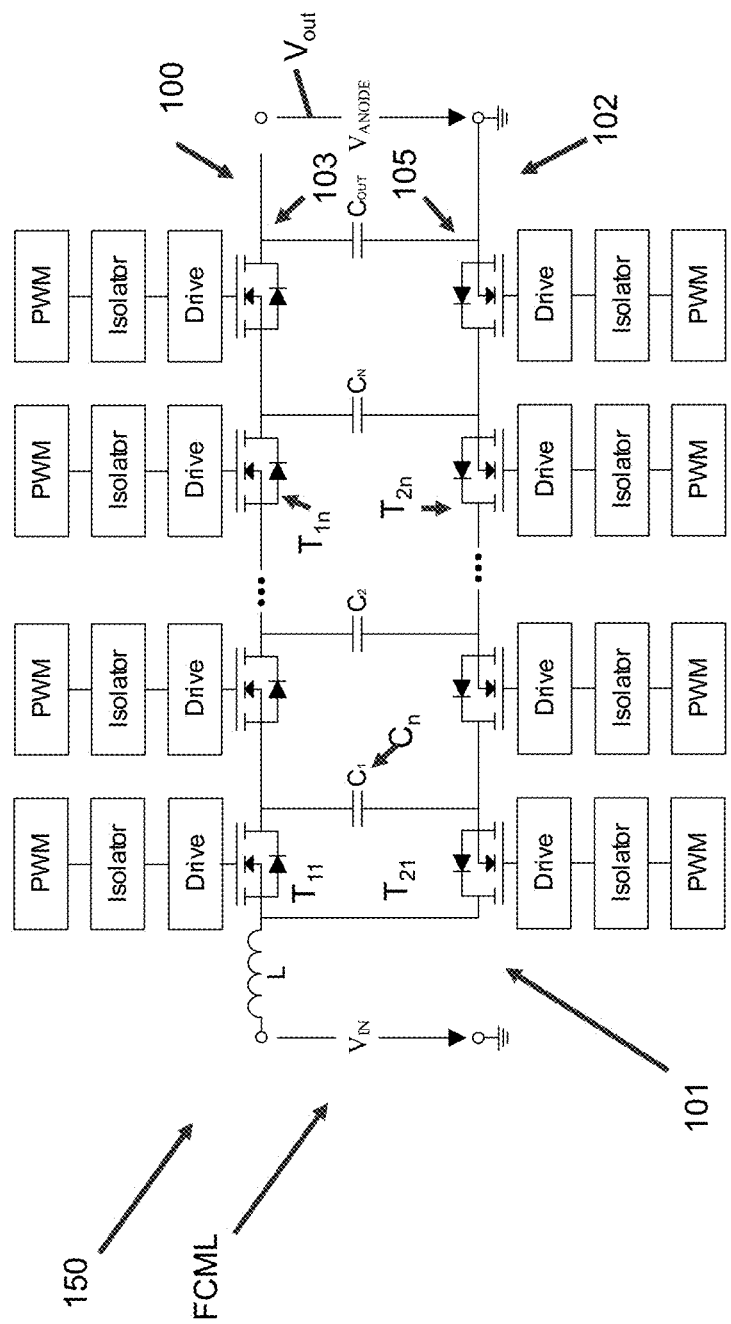
FIG. 1 illustrates a Flying Capacitor Multilevel Converter (FCML) that can be used to drive a plasma load according to one or more embodiments described herein.

FIG. 1 illustrates a DC-DC converter (DC is direct current) comprising a Flying Capacitor Multilevel Converter (FCML) circuit acting as a switched capacitor converter with a common inductive element L.

The FCML includes a plurality of n cells 101 (n is an integer) each including a capacitor $C_n$ having a first terminal 103 and a second terminal 105 (where n denotes the cell in which the capacitor is located); a first transistor $T_{1n}$, a second transistor $T_{2n}$ (where the subscript n denotes the cell in which the transistor is located); a first voltage rail 100 having an input connected to an output of the inductor L and including the first transistors $T_{1n}$ connected in series; and a second voltage rail 102 comprising the second transistors $T_{2n}$ connected in series. The first voltage rail and/or the second voltage rail may comprise a floating voltage rail. In one or more examples, the first transistors $T_{1n}$ may be replaced with rectifiers such as diodes.

The capacitors Cn are connected in parallel between the first voltage rail and the second floating voltage rail, such that the first terminal of each of the capacitors are connected to the first voltage rail and the second terminal of each of the capacitors are connected to the second rail.

The output from the channel of the second transistor $T_{21}$ in the first cell is connected to the first voltage rail at the output from the inductor and is charged to a voltage Vn at the output of the first transistor $T_{11}$ when the first transistor $T_{11}$ and the second transistor $T_{21}$ are pulsed on and off. The output from the channel of the nth second transistor $T_{2n}$ is connected to the second terminal of the n−1$^{th}$ capacitor $C_{n-1}$ in the n−1$^{th}$ cell. In this way, the transistors $T_{1n}$, $T_{2n}$ in each of the n cells are pulsed on and off out of phase with respect to transistors in other cells (or with an appropriate phase and duty cycle D) and in sequence such that when the second transistor $T_{2n}$ (n>1) is switched on the nth capacitor Cn is charged from the voltage across the n−1$^{th}$ capacitor $C_{n-1}$ in the n−1th cell. The output from the DC-DC converter is across the capacitor Cout in the last cell.

The FCML is best suited for high conversion ratio applications and allows the use of low-voltage devices in high-voltage converters. Key system benefits include 28V:500V conversion at >95% efficiency, the high frequency inductor reducing mass and volume compared to traditional boost designs, and the circuit dividing high output voltage over low-voltage GaN FETs for improved efficiency Typical methods for driving the gates of the transistors include:

1. utilizing individual signal isolators combined with individual isolated power converters to provide isolated signal/power. Least mass/volume efficient approach.
2. utilizing individual signal isolators combined with diode-bootstrapped capacitors and low-dropout regulators to provide isolated signal/power. Much better mass/volume than method #1 for terrestrial applications, but poor mass/volume in space applications due to larger components and high component count.

FIGS. 2A and 2B illustrates FCML gate driving according to one or more embodiments of the present invention. The new method utilizes individual signal isolators combined with a single centralized isolated flyback converter to minimize mass/volume for space applications. The flyback is controlled by a single ground-referenced PWM IC (PWM integrated circuit) and utilizes a 2n+2 winding flyback transformer to produce 2n rails referenced to the FCML FET sources and one ground-referenced housekeeping rail.

FIG. 2A illustrates the DC flyback converter (PWM in FIG. 1) and FIG. 2B illustrates the digital isolator (isolator in FIG. 1) and GaN HEMT driver (driver in FIG. 1).

As illustrated in FIG. 2A, the DC-DC flyback converter 201 comprises a PWM control 200 outputting a clock signal for modulating the current in a transformer 202 via a transistor 204. The transformer comprises a primary coil 206 magnetically coupled to a plurality m of secondary coils 208 wound around a common central core. The number m of secondary coils is equal to the number of transistors in the FCML circuit (twice the number of cells in FIG. 1, i.e., m=n*2). The current induced in each of the secondary coils (by the current in the primary coil) is used to generate an output gate voltage $V_m$ using a diode 210 and a capacitor 212. In this way, a DC-DC flyback converter 201 comprises a plurality m of isolated outputs 230 (one for each of the transistors Tm comprising first transistors $T_{1n}$ and second transistors $T_{2n}$). The output gate voltage $V_m$ from the m$^{th}$ isolated output is applied to the GaN HEMT driver for one of the transistors $T_{1n}$, $T_{2n}$ as illustrated in FIG. 2B. Each of the gate voltages $V_m$ have a different magnitude to switch the transistors on and off because they are referenced to (or applied with respect to) the voltage rail (or transistor source contact Vsm) in different cells which are at different potentials.

Figure 7:
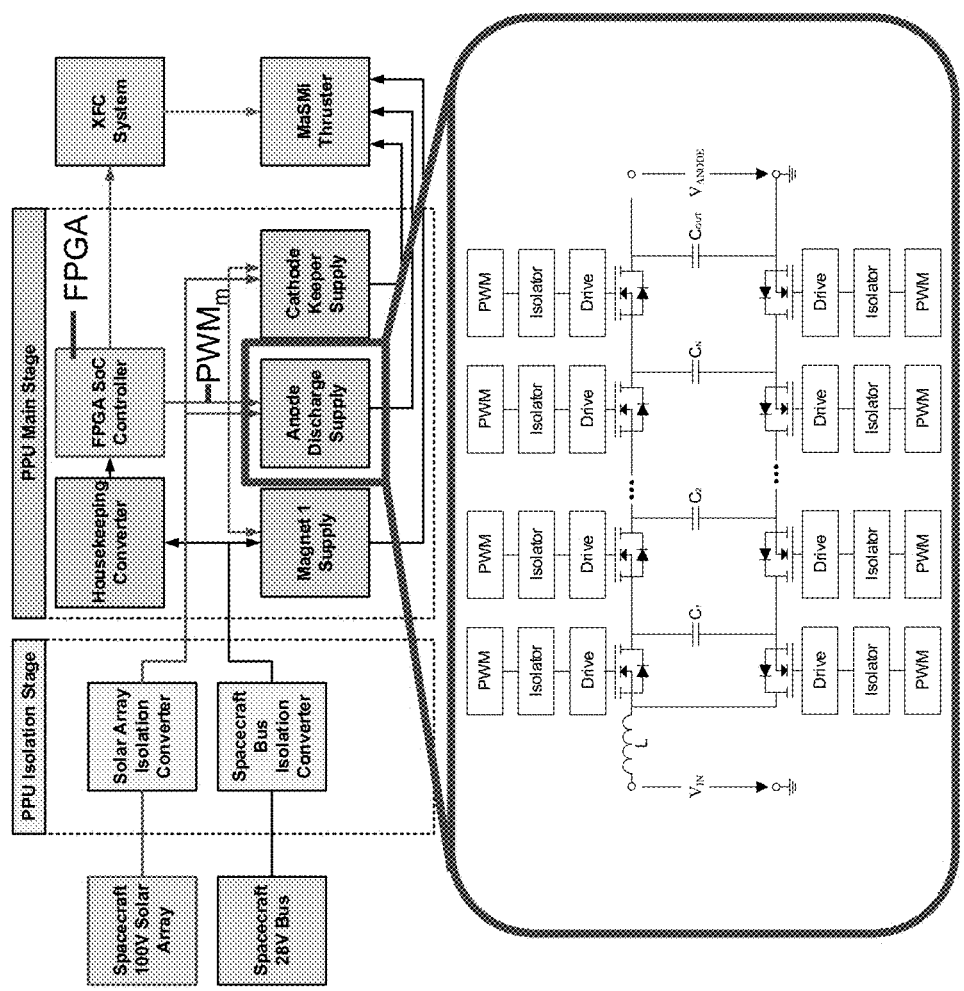
FIG. 7 illustrates implementation of the FCML circuit in the power processing unit (PPU) of the hall effect thruster.

FIG. 2B illustrates a driver circuit 222 and a digital isolator 220 for isolating the PWM signal from the first voltage rail 100 and the second voltage rail 102. The circuit includes m=2n driver circuits 222 and m=2n digital isolator circuits, so that each of the driver circuits 222 is connected to one of the isolated outputs 230 of the DC-DC flyback converter 201. A modulator modulates each of the output gate voltage $V_m$ with a duty cycle D having a different phase $PWM_m$, so that each of the gates G of the transistors $T_m$ are biased with a gate voltage $V_m$ having a different magnitude and modulated with the duty cycle D having a different phase $PWM_m$ to charge the capacitors Cn appropriately and obtain the desired output voltage Vout (as described in FIG. 1). As illustrated in FIG. 2B, for each m, each gate G of a transistor $T_m$ (transistor T1n or T2n in FIG. 1) is biased with a duty cycle having a phase $PWM_m$ and a magnitude $V_m$ (outputted from the isolated output 230 connected to the gate) with respect to the potential $V_{SM}$ at the source of the transistor Tm. The modulator outputting the phased duty cycle $PWM_m$ may comprise a field programmable gate array (FPGA) as illustrated in FIG. 7, an integrated circuit, processor, controller, or other electronic components.

Figure 2C:
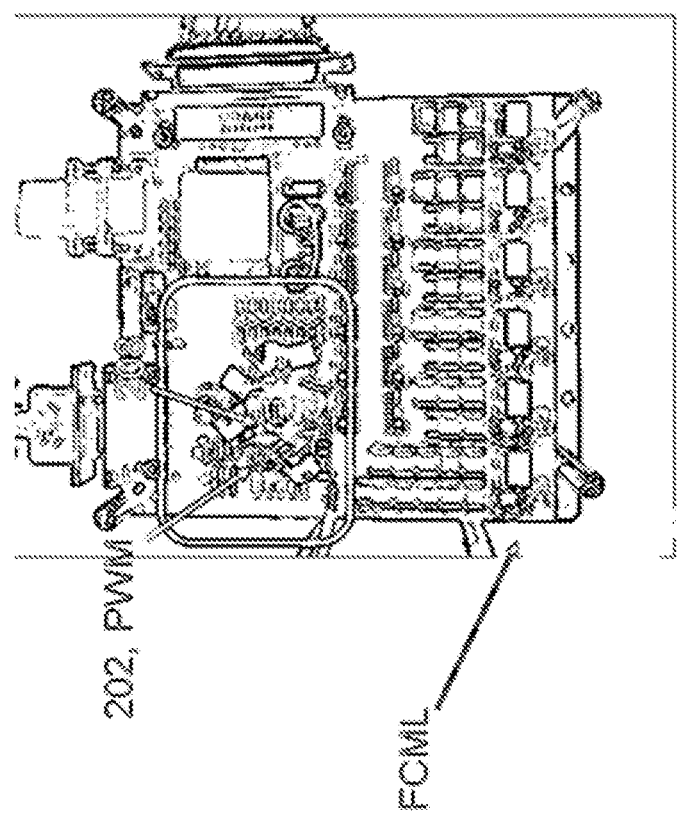

FIG. 2C illustrates the printed circuit board assembly including the DC-DC flyback converter and FCML.

Thus, FIGS. 1 and 2A-2C illustrate a DC-DC converter circuit 150, comprising an inductor (L) and a flying capacitor multilevel (FCML) converter circuit connected to the inductor. The FCML includes a plurality of transistors Tm (first transistors T1n and T2n) distributed in a plurality of n cells 101 so that each of the cells includes a first transistor $T_{1n}$, a second transistor $T_{2n}$ and a capacitor Cn having a first terminal 103 and a second terminal 105; a first voltage rail 100 connected to an output of the inductor L and including the first transistors $T_{1n}$ connected in series, each of the first transistors $T_{1n}$ having a first gate; and a second voltage rail 102 comprising the second transistors $T_{2n}$ connected in series, each of the second transistors having a second gate. Each of the cells 101 are switched on and off to charge the capacitors Cn in response to a gate voltage Vm applied to each of the first gates and the second gates (i.e., for each m, gate voltage Vm with duty cycle having phase $PWM_m$ is applied to the gate of transistor Tm). The gate voltages Vm applied to the first gates are modulated by a duty cycle and referenced to the first voltage rail at the location of the input (e.g., the source Vsm) to the first transistor. The gate voltages applied to the second gates are modulated by the duty cycle D and referenced to the second voltage rail 102 at the location of the input (e.g., source) to the second transistor T2n. In this way, the gate voltages applied to each of the gates are different and the voltage Vm applied to the gate is modulated with a phase PWMm and duty cycle D by a modulator.

As illustrated in FIG. 2A, the DC-DC converter circuit further includes a gate driver circuit comprising a DC-DC flyback converter 201 having multiple isolated outputs 230 (a total of m isolated outputs, one for each of the transistors, or 2 per cell). Each of the isolated outputs 230 outputs the gate voltage $V_m$ to the driver circuit 222 of the transistor Tm in each cell (each of the gate voltages Vm referenced to the source Vsm of the respective transistor Tm); and a modulator modulating each of the m phases for each of the m gate voltages Vm with the duty cycle D. The gate driver circuit further comprises a plurality of isolation circuits 220, each of the isolation circuits isolating the modulator from the voltage rails 100, 102 comprising floating voltage rails.

As illustrated in FIG. 2A, the flyback converter comprises a transformer including a primary coil magnetically coupled to a plurality of secondary coils wound around a central core, a controller circuit 200 modulating a current through the primary coil 206, wherein the current in the primary coil induces a secondary current in each of the secondary coils. Each of the secondary coils are connected to a diode and a capacitor converting the current into a gate voltage Vm to form the plurality m of isolated outputs 230.

FIGS. 1, 2A-2C further illustrate an example wherein the DC-DC converter circuit comprises an inductor (L); a flying capacitor multilevel (FCML) converter circuit connected to the inductor and including a plurality m of transistors including a plurality of first transistors $T_{1n}$ and a plurality of second transistors $T_{2n}$, where m an n are integers and the FCML further comprises a plurality of n cells 101 each including one of the first transistors $T_{1n}$, one of the second transistors $T_{2n}$, and a capacitor having a first terminal and a second terminal; a first voltage rail 100 connected to an output of the inductor and including first transistors connected in series; a second voltage rail comprising the second transistors connected in series; and a gate driver circuit comprising a DC-DC flyback converter 201 having a plurality m of isolated outputs 230, wherein m=2n and each of the m isolated outputs 230 are electrically connected to the gate of one of the transistors. In one or more examples, the m isolated outputs 230 are electrically isolated from each other. In one or more examples, each of the isolated outputs 230 apply a voltage Vm to the gate having a phase m or PWMm modulated by a modulator and having a duty cycle D.

In various examples, the transistors comprise field effect transistors (FET) (e.g., GaN high electron mobility transistors, HEMTs or MOSFETs) and the output voltage is distributed across the cells so that less than 100 V is across each of the transistors.

In various examples, the DC-DC converter the converter is a boost converter or a buck converter.

In various examples, the boost converter boosts an input voltage less than 50V inputted to the inductor to an output voltage greater than 500 Volts outputted from the last cell so as to drive the load of at least 1 kilowatt (kW) connected to the output.

In one or more examples, the load connected to the FCML circuit at Vout or Vanode in FIG. 1 comprises a plasma load, a load comprising a plasma, or an oscillating load wherein current is oscillating periodically in time. In one or more examples, the plasma comprises an ionized gas or fluid comprising positive ions and free electrons or negative charge. In one or more examples, the plasma comprises the positive ions and negative charge in proportions resulting in more or less no overall electric charge. In one or more examples, the plasma comprises Xenon (Xenon ions) however other ions may also be used.

Example Control Architecture

Figure 3:
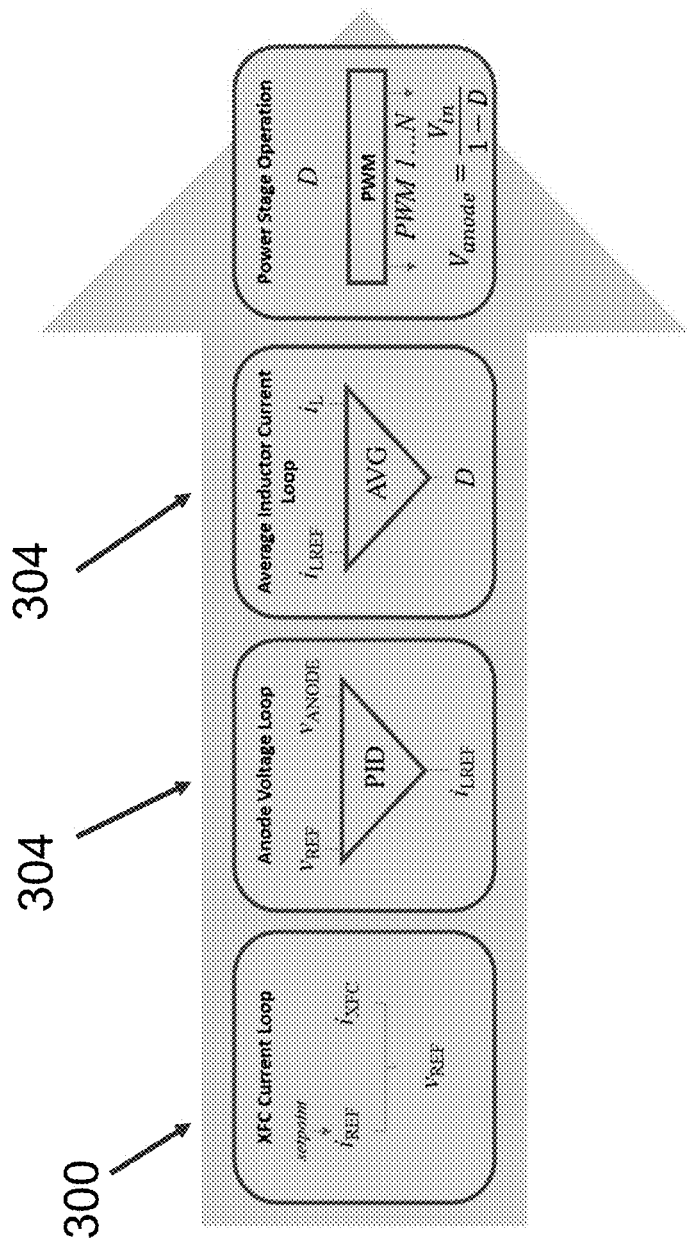
FIG. 3 illustrates control circuitry for the FCML according to one or more embodiments described herein.

FIG. 3 illustrates the controller for controlling the FCML in an application wherein the FCML is driving a plasma load. The control circuitry is illustrated in the context of the plasma load comprising a Xenon flow used in a Hall Effect Thruster. The control circuitry includes a Xenon Flow Controller (XFC). The XFC modulates the amount of Xe that is passed to the thruster based on a feedback loop closed around the PPU discharge current (which is directly proportional to Xe flow rate).

An outer loop XFC controller interprets a commanded thrust setpoint and adjusts XFC valves to allow for requisite current flow. An anode voltage loop takes the computed reference voltage based on XFC current and the commanded setpoint and utilizes a PID loop to drive the error relative to the measured output voltage to 0. The result is passed to the average current controller. An average current control utilizes a cycle by cycle average of the inductor current to ensure that the converter does not produce excess current on the output. Based on the requisite current, a duty cycle D is generated and sent to the PWM generator. PWM signals are sent to switching cells 1 . . . N to drive FCML FETs.

Thus FIGS. 1 and 3 illustrate a DC-DC converter circuit, comprising an inductor L; a flying capacitor multilevel (FCML) converter circuit connected to the inductor L and including a plurality of cells, each of the cells including two semiconductor switches (e.g., transistors T1n, T2n) and a capacitor Cn and the FCML converter circuit having an output Vout. The converter circuit further comprises a modulator switching the semiconductor switches on and off according to a duty cycle D, the duty cycle controlling a voltage charging the capacitor in each of the cells; and a load comprising a plasma across the output requiring a load current for operation of the load.

The DC-DC converter circuit further comprises a first control circuit 300 connected to the FCML circuit, the first control circuit determining the load current associated with a desired power output from the load; and determining a desired output voltage associated with the load current.

The DC-DC converter circuit further comprises a second control circuit 302 that drives an inductor current ($I_L$) through the inductor so that the output applies an output voltage comprising the desired output voltage or the output voltage sufficiently close to the desired output voltage.

The DC-DC converter circuit further comprises a third control circuit 304 obtaining a comparison of an average of the inductor current ($I_L$) through the inductor with a predetermined reference current ($I_{LREF}$) and setting the duty cycle so that the average does not exceed the predetermined reference current (e.g., in the case of an electrical short).

Example Thermal Extraction

FIGS. 4A-4F illustrates modular copper thermal straps 400 are mounted to each top-side cooled GaN FET, allowing for conductive cooling to the chassis without placing strain on low profile GaN FETs from common thermal strap solution. Minute differences in GaN component height and interference from other components prevent use of typical thermal strap approaches. Terrestrial modular heat sinks with convective cooling systems cannot be used in flight designs.

Figure 4:
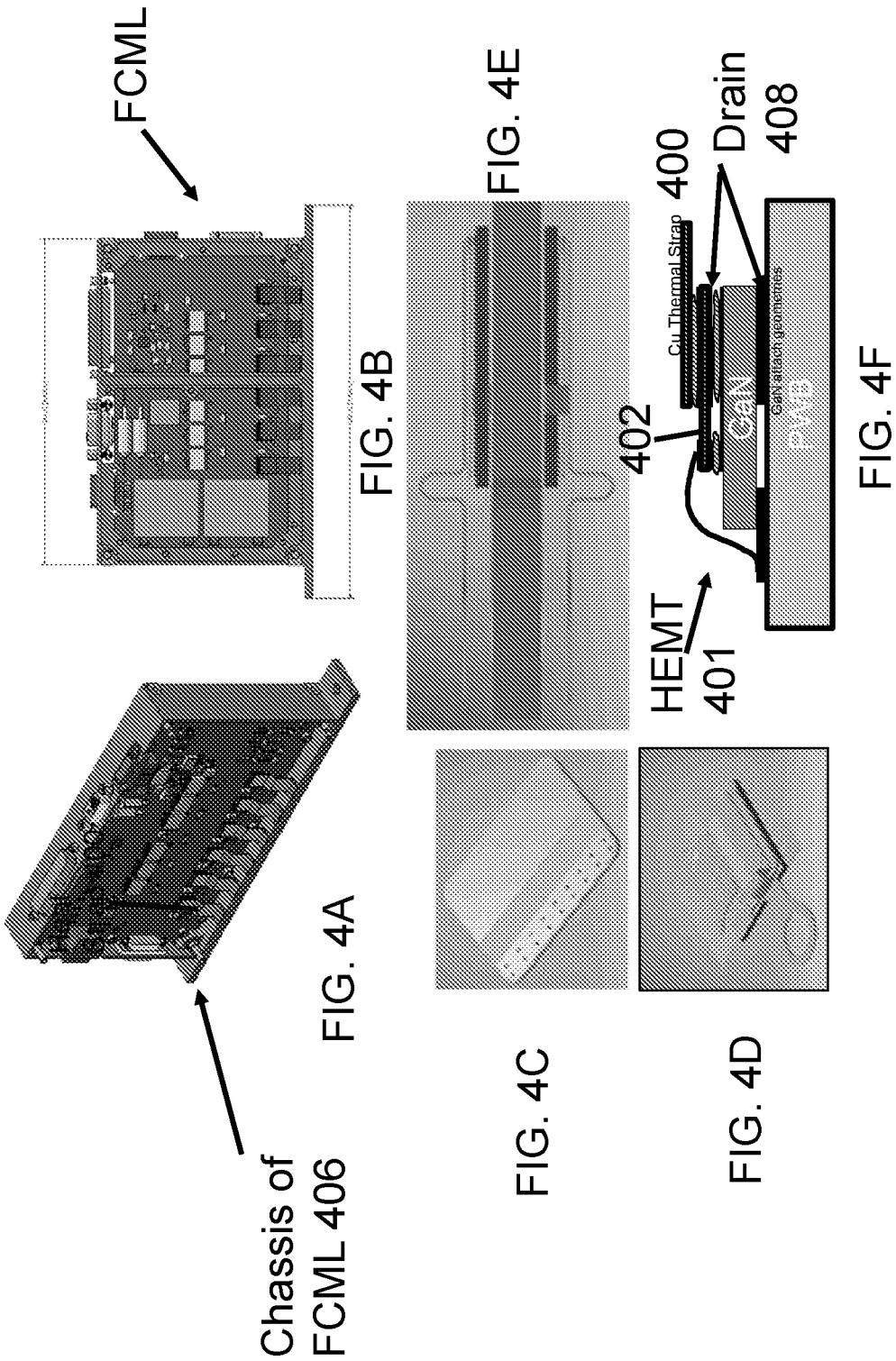

Thus FIG. 4 illustrates a thermal strap 400 thermally connecting each of the transistors 401 to a heat sink 406, so that heat is conducted by the thermal strap from the transistor to the heat sink so as to cool the transistors or switches; and a material 402 comprising a thermal conductor and an electrical isolator between each of the thermal straps 400 and each of the transistors 401. In one or more examples, the material is connected at one end to a contact (e.g., drain 408) of the transistor or switch and at another end to the heat sink 406 or chassis. Example materials 402 that both are thermal conductor and a thermal insulator include, but are not limited to, aluminum nitride (AlN) and beryllium oxide. Example thermal straps include a metal such as, but not limited to, copper. The thermal strap may comprise a metal strip for example.

Example Spacecraft Application

One or more spacecraft applications require a combined propulsion system targeted for ~200 kg spacecraft with mission targets throughout the solar system, including the NASA programs such as Discovery, New Frontiers, Simplex, and other major program interests. The nearest term flight opportunity is the Simplex mission Lunar Trailblazer. Beyond JPL, there are many other Hall Effect missions at NASA that could benefit from this technology, and a large commercial sector that is expanding for Hall Effect propulsion. ASTRAEUS is the first space-rated application and first plasma load application of the FCML converter.

Solar Electric Propulsion (SEP) systems for small spacecraft enable a class of deep space missions to bodies not reachable with conventional propulsions systems. Examples of maneuvers that can be executed using SEP systems include direct Pluto injection orbits, Phobos spiral-down maneuvers, Venus orbital change maneuvers, Asteroid and comet exploration, and Uranus and Neptune orbiters with RTGs.

Figure 5:
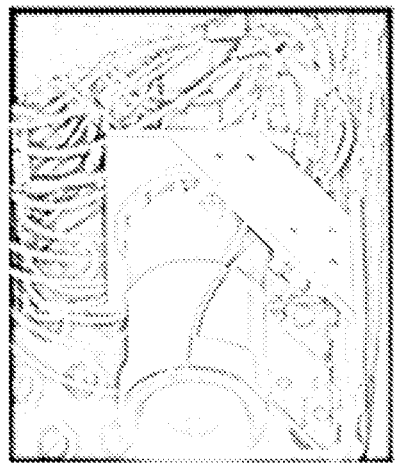
FIG. 5 illustrates a hall effect thruster powered using the FCML according to one or more embodiments described herein.

Solar Electric Propulsion use Hall effect thrusters (as illustrated in FIG. 5) that require unique power systems elements in order to operate. Hall Effect Thrusters have been identified as an enabler for deep-space Small Sat missions to targets outside the range of conventional propulsion. Requirements of the Hall Effect thruster include:

1. a high voltage, high power anode supply (1 kW, 500V). Higher input voltage correlates with higher specific impulse. Higher power correlates with higher thrust.

2. High voltage, low power cathode supply to ignite engine.

3. Xenon flow-control elements.

Figure 6:
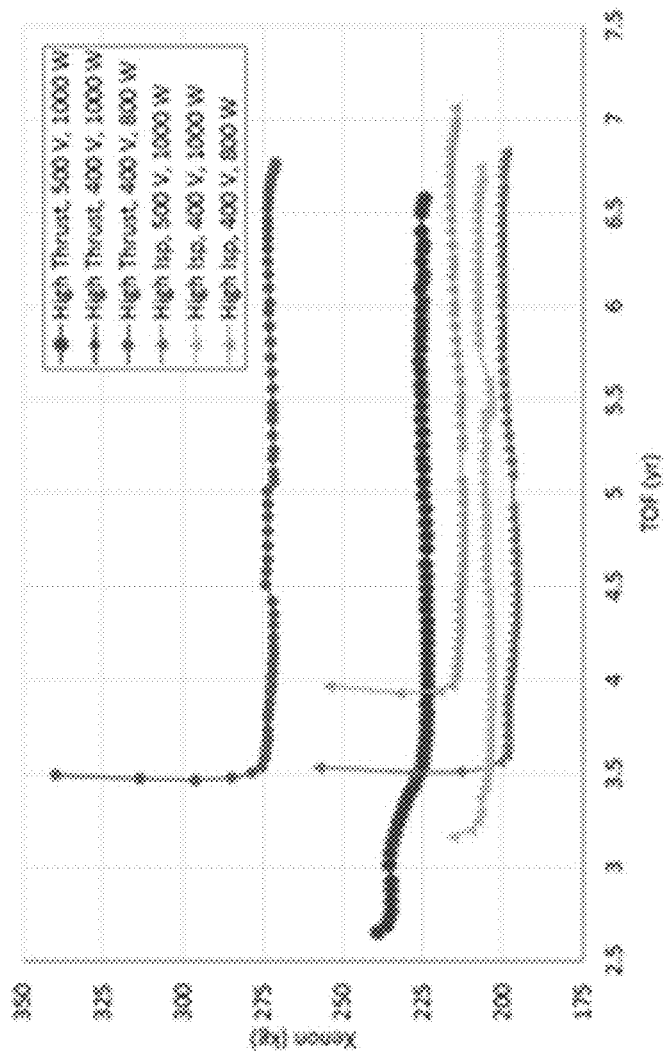
FIG. 6 illustrates xenon flow requirements for the hall effect thruster, plotting xenon flow as a function of time of flight (TOF) in years (yr).

FIG. 6 illustrates typical xenon requirements for a spiral down orbital injection.

High output voltage requirements (500V) demand a solution that either (a) relies on high voltage semiconductor devices or (b) divides the output voltage over multiple low-voltage devices. This problem is simple to solve in terrestrial applications, where SiC MOSFETs or Si IGBTs are available into the 20 kV range. However, for spacecraft applications, single event effects (SEEs) and limitations in radiation-hardened Si MOSFETs makes part selection challenging and eliminates certain well-understood topologies (e.g. Flyback, Full-Bridge, LLC, etc.) from consideration when wide duty cycles are required.

To address the above two challenges, embodiments of the present invention use the newly developed anode supply technology based on a Flying Capacitor Multilevel (FCML) converter utilizing GaN High Electron Mobility Transistors (HEMTs), as illustrated herein. The FCML converter is optimized for the oscillating plasma loads produced by Hall Effect thruster systems.

FIG. 7 illustrates a 1 kW PPU for the MaSMi Hall Effect Thruster implementing the FCML circuit according to embodiments described herein. The PPU has the following specifications/requirements that can be met using embodiments of the FCML converter described herein:

input voltage: 22-100 V
PPU Output Voltage (500 V, 1000 W)
Efficiency at maximum power: 90%
Efficiency at minimum power≥80%
Total PPU Mass<3 kg.
Total volume≤1 L.
Power sequencing for PPU converters.
Rated to predetermined testing standards (environment).
Radiation hardened to 20 krad.

TABLE 1

PPU Converter Input and Output Power L5 Requirements

| PPU Element | Input Source | Max Power (W) | Min Input Voltage (V) | Max Input Voltage (V) | Min Output Voltage (V) | Max Output Voltage (V) | Min Current (A) | Max Current (A) |
|---|---|---|---|---|---|---|---|---|
| Discharge | Solar Array or Bus | 1000 | 20 | 100 | 200 | 500 | 0.5 | 4 |
| Keeper | Solar Array or Bus | 80 | 20 | 100 | 10 | 1000 | 0.05 | 0.5 |
| Magnet | Bus | 80 | 22 | 36 | 4 | 24 | 0.5 | 3 |
| FPGA | Bus | 3.3 | 22 | 36 | 3.3 | 3.3 | 0 | 1 |

Multilevel switched-capacitor converters, such as the FCML converter, provide numerous benefits for Hall Effect thrusters, in both enabling higher anode voltages and reducing PPU mass and volume. Typically, increased anode voltage in thrusters like ASTRAEUS correlates to higher system ISP, allowing for reduction in requisite Xenon mass, at the expense complicating anode converter design and reducing PPU efficiency.

Here the FCML provides a distinct advantage over conventional flyback and dual active bridge converters, by dividing the high voltage output equally over the switching cells in the converter, preventing any switching device from supporting the full output voltage. This enables ASTRAEUS to reach a 500V output with low voltage devices, rather than relying on diode rectification to achieve converter performance.

Further, it enables the use of 650V GaN HEMTs, which have been shown to be tolerant to both Single Event Effects and Total Ionizing Dose, making them ideally suited for use in spacecraft power converters. These devices reduce switching and conduction losses in the FCML converter, while simultaneously enabling switching frequencies into the MHz range. Additionally, these devices have been shown in testing by both NASA and other organizations to be tolerant to both Single Event Effects and Total Ionizing Dose, making them ideally suited for next generation power conversion systems.

This specific FCML application makes adjustments to the previously demonstrated control structures and converter architecture to accommodate the unique performance aspects of powering Hall Effect thrusters. In one example application of the FCML converter to a Hall Effect Thruster, the converter is designed to convert from standard 28 V bus levels to an anode output of 200-500 V with a 1 kW maximum load. The high voltage is divided across the 6 switching captivate cells (5.5 microfarads each), resulting in no more than 100 V on a given transistor (650 V GaN HEMT). Converter efficiency is modeled at minimum of 96% and will be tested across the load and voltage range, while volume and mass requirements for the PPU are 3 kg and 2 L, respectively.

As described above, the controller is designed differently than previous FCML systems, with a three-level control system. The inner loop is a fast average-current controller, designed to regulate inductor current in the converter for stable operation. The middle loop is a slow voltage controller, designed to push the current in the inductor towards the desired voltage operating point. The outer loop is a slow xenon flow controller loop, that regulates the steady state current through the system at the given operating point. The collective system fits on a 9 cm×10 cm PCB.

Thus, FIG. 5-7 illustrate a propulsion system 500, comprising the DC-DC converter circuit 150 of FIG. 1, FIG. 2 and FIG. 3, comprising an anode connected to the output Vanode of the last cell (nth cell), wherein the desired output voltage from the output is used to generate an electric field or electromagnetic field used to guide and/or accelerate charged particles so that the charged particles generate the desired output comprising a thrust. In one or more examples, the propulsion system comprises a hall effect thruster or ion thruster.

In one or more examples, a photovoltaic module converts solar radiation into electricity having a first voltage, wherein the booster converter of FIG. 1 boosts the first voltage to a second voltage Vanode applied to the electrode (e.g., anode) to generate the thrust.

Other Example Applications

The converter circuits described herein can be used in any system that uses or drives a plasma, including but not limited to, a metal deposition process, system, or apparatus (e.g., sputtering apparatus) using high voltages and the plasma or a plasma cleaning process or system using high voltages and the plasma. For example, the output Vout from the converter 150 can be used to drive the load comprising the plasma in the apparatus utilizing the plasma, e.g., to deposit, clean or etch.

Advantages and Improvements

There are several innovations in this technology development that allow the use of the FCML in space environments and are particularly suited to driving anode supplies at high voltage:

1. Multi-output flyback floating gate drivers: The FCML is dependent on floating voltage supplies to its various switching cells, referenced to the switching device's source. In terrestrial applications, this is often achieved either with sequential charge pumps or with individual isolated DC/DC converters. However, the restrictions imposed by designing for space eliminate those as feasible options due to the high mass and volume of the circuitry. Instead, this design has demonstrated a 13-output flyback-based gate drive system with low-side GaN drivers for safe, rapid turn-on of the GaN HEMTs in a radiation-tolerant manner.

2. Dual-sided GaN switching cell cooling techniques: In terrestrial applications, many cooling methods have been demonstrated for top-side cooled GaN HEMTs, based on individual heat sinks with convective air cooling. In this work, no air flow is possible. Instead, a modular heat-strap system has been designed to couple GaN devices on both sides of a PCB through a low thermal resistance path to the spacecraft chassis. See the attached documentation for images.

3. Fault-tolerant digital control of phase-shifted pulse width modulation (PWM): The FCML converter type requires sophisticated control, with each cell requiring two complimentary PWM signals that are phase shifted from the other cells, but are tied to the same clock. In terrestrial applications, these are easily achieved in microcontroller or FPGA designs, which do not easily scale to flight. Instead, the PWM and control generation are designed on a split radiation-tolerant system on chip microprocessor and a radiation-hardened FPGA, allowing for precise control of the PWM clock timing while maintaining fast control loop processor speed.

4. Pulsed plasma control: Due to the oscillatory nature of the plasma load in a Hall Effect thruster, the inductor in the FCML must be controlled differently in order to source the current required for graphite bursts during testing. It must therefore be capable of riding through momentary output shorts. To meet that need, this work implements an average current controller on a rapid control loop that prevents the output current from rising to a shorted output and simultaneously regulates the Anode oscillations to lower total ripple than conventional converters, reducing the need for large output voltage filters.

REFERENCES

The following references are incorporated by reference herein.

[1] T. A. Meynard and H. Fock in their paper entitled "Multi-level conversion: high voltage choppers and voltage-source inverters" in IEEE Power Electronics Specialists Conference.

[2] Rentmeister, J. S., Schaef, C., Foo, B. X., and Stauth, J. T., "A Flying Capacitor Multilevel Converter with Sampled Valley-Current Detection for Multi-Mode Operation and Capacitor Voltage Balancing," in IEEE Energy Conversion Congress and Exposition (ECCE), Milwaukee, Wis., 2016.

[3] Ye, Z., Lei, Y., Lui, W-C., Shenoy, P. S., Pilawa-Podgurski, R. C. N, "Improved Bootstrap Methods for Powering Floating Gate Drivers of Flying Capacitor Multilevel Converters and Hybrid Switched-Capacitor Converters," in IEEE Transactions on Power Electronics, vol. 35, no. 6, pp. 5965-5977, June 2020.

[4] Ye, Z., Lei, Y., Lui, W-C., Shenoy, P. S., Pilawa-Podgurski, R. C. N., "Design and Implementation of a Low-cost and Compact Floating Gate Drive Power Circuit for GaN-based Flying Capacitor Multi-Level Converters", 2017 IEEE Applied Power Electronics Conference and Exposition (APEC), Tampa, Fla., 2017, pp. 2925-2931

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A DC-DC converter circuit, comprising:
an inductor;
a flying capacitor multilevel (FCML) converter circuit connected to the inductor and including a plurality m of transistors including a plurality of first transistors $T_{1n}$ and a plurality of second transistors $T_{2n}$, where m an n are integers and the FCML further comprises:
a plurality of n cells each including one of the first transistors $T_{1n}$, one of the second transistors $T_{2n}$, and a capacitor having a first terminal and a second terminal;
a first voltage rail connected to an output of the inductor and including first transistors connected in series, each of the first transistors having a first gate;
a second voltage rail comprising the second transistors connected in series, each of the second transistors having a second gate; and
wherein each of the cells are switched on and off to charge the capacitors in response to gate voltages $V_m$ applied to the first gates and the second gates,
for each of the number n of first transistors $T_{1n}$, the gate voltage $V_m=V_{1n}$ applied to the first gate of the $T_{1n}{}^{th}$ first transistor is modulated by a duty cycle and referenced to the first voltage rail at a location of an input to the $T_{1n}{}^{th}$ transistor;
for each of the number n of second transistors $T_{2n}$, the gate voltage $V_m=V_{2n}$ applied to the second gate of the $T_{2n}{}^{th}$ second transistor is modulated by the duty cycle and referenced to the second voltage rail at the location of the input to the second transistor;
a gate driver circuit comprising:
a DC-DC flyback converter having a plurality m of isolated outputs, wherein m=2n:
each of the m isolated outputs outputting the gate voltage $V_m$ to the driver circuit of the $m^{th}$ transistor; and
one or more modulators modulating each of the gate voltages Vm with the duty cycle D and having a phase $PWM_m$; and
a plurality of isolation circuits, each of the isolation circuits isolating the one or more modulators from the voltage rails comprising floating voltage rails.

2. The circuit of claim 1, further comprising:
a thermal strap thermally connecting each of the transistors to a heat sink, so that heat is conducted by the thermal strap from the transistors to the heat sink so as to cool the transistors or switches; and
a material comprising a thermal conductor and an electrical isolator between each of the thermal strap and each of the transistors.

3. The circuit of claim 2, wherein the material is connected at one end to a contact of the transistor or switch and at another end to the heat sink or chassis.

4. The circuit of claim 3, wherein the contact is a drain of the transistor.

5. The circuit of claim 1, further comprising:
a load comprising a plasma across an output of the FCML and requiring a load current for operation of the load;
a first control circuit connected to the FCML circuit, the first control circuit:
determining the load current associated with a desired power output from the load; and
determining a desired output voltage associated with the load current;
a second control circuit that drives an inductor current ($I_L$) through the inductor so that the output applies an output voltage comprising the desired output voltage or the output voltage sufficiently close to the desired output voltage; and
a third control circuit obtaining a comparison of an average of the inductor current ($I_L$) through the inductor with a predetermined reference current ($I_{LREF}$) and setting the duty cycle so that the average does not exceed the predetermined reference current.

6. A propulsion system, comprising the DC-DC converter circuit of claim 1, comprising:
an anode connected to an output of the last one of the cells (nth cell), wherein a desired output voltage from the output is used to generate an electric field or electromagnetic field used to guide and/or accelerate charged particles so that the charged particles generate the desired output comprising a thrust.

7. The propulsion system of claim 6, wherein the propulsion system comprises a hall effect thruster or ion thruster.

8. A spacecraft comprising the DC-DC converter circuit of claim 1.

9. The spacecraft of claim 8 comprising a satellite.

10. The converter of claim 1, further comprising a load connected to the FCML circuit, the load comprising a plasma load, a load comprising a plasma, or an oscillating load wherein current is oscillating periodically in time.

11. A deposition system or cleaning system utilizing a plasma and comprising the DC-DC converter circuit of claim 1.

12. A DC-DC converter circuit, comprising:
an inductor;
a flying capacitor multilevel (FCML) converter circuit connected to the inductor and including a plurality of cells, each of the cells including two semiconductor switches and a capacitor and the FCML converter circuit having an output;
a modulator switching the semiconductor switches on and off according to a duty cycle, the duty cycle controlling a voltage charging the capacitor in each of the cells;
a load comprising a plasma across the output requiring a load current for operation of the load;
a first control circuit connected to the FCML circuit, the first control circuit:
determining the load current associated with a desired power output from the load; and
determining a desired output voltage associated with the load current;
a second control circuit that drives an inductor current ($I_L$) through the inductor so that the output applies an output voltage comprising the desired output voltage or the output voltage sufficiently close to the desired output voltage; and
a third control circuit obtaining a comparison of an average of the inductor current ($I_L$) through the inductor with a predetermined reference current ($I_{LREF}$) and setting the duty cycle so that the average does not exceed the predetermined reference current.

13. The circuit of claim 12, wherein the second control circuit comprises a proportional-integral-derivative controller loop driving a difference to zero, wherein the difference is between the output voltage (measured at the output) and the desired output voltage.

14. The circuit of claim 12, wherein the average comprises a cycle by cycle average of the inductor current.

15. The circuit of claim 12, further comprising:
a thermal strap thermally connecting each of the switches to a heat sink, so that heat is conducted by the thermal strap from the switches to the heat sink so as to cool the switches; and
a material comprising a thermal conductor and an electrical isolator between the thermal strap and each of the switches.

16. The circuit of claim 15, wherein each of the switches comprise a contact and the material is connected at one end to the contact and at another end to the heat sink or chassis.

17. The circuit of claim 16, wherein the contact is a drain of a transistor.

18. A spacecraft comprising the DC-DC converter of claim 12.

19. A propulsion system, comprising the DC-DC converter circuit of claim 12, comprising:
an anode connected to the output of the last one of the cells (nth cell), wherein a desired output voltage from the output is used to generate an electric field or electromagnetic field used to guide and/or accelerate charged particles so that the charged particles generate a desired output comprising a thrust.

20. The propulsion system of claim 19, wherein the propulsion system comprises a hall effect thruster or ion thruster.

21. A DC-DC converter circuit, comprising:
an inductor;
a flying capacitor multilevel (FCML) converter circuit connected to the inductor and including a plurality m of transistors including a plurality of first transistors $T_{1n}$ and a plurality of second transistors $T_{2n}$, where m an n are integers and the FCML further comprises:
a plurality of n cells each including one of the first transistors $T_{1n}$, one of the second transistors $T_{2n}$, and a capacitor having a first terminal and a second terminal;
a first voltage rail connected to an output of the inductor and including first transistors connected in series;
a second voltage rail comprising the second transistors connected in series; and
a gate driver circuit comprising a DC-DC flyback converter having a plurality m of isolated outputs, wherein m=2n and each of the m isolated outputs are electrically connected to a gate of one of the transistors.

* * * * *